(12) United States Patent
Reis

(10) Patent No.: US 7,759,143 B2
(45) Date of Patent: Jul. 20, 2010

(54) SYSTEM AND METHOD FOR SEPARATING AND PACKAGING INTEGRATED CIRCUITS

(75) Inventor: Antonio L. Reis, Tracy, CA (US)

(73) Assignee: XCI, Inc., Cupertino, CA (US)

( * ) Notice: Subject to any disclaimer, the term of this patent is extended or adjusted under 35 U.S.C. 154(b) by 86 days.

(21) Appl. No.: 12/099,264

(22) Filed: Apr. 8, 2008

(65) Prior Publication Data

US 2008/0184542 A1 Aug. 7, 2008

Related U.S. Application Data

(62) Division of application No. 11/288,464, filed on Nov. 28, 2005, now Pat. No. 7,517,725.

(51) Int. Cl.
*H01L 21/00* (2006.01)

(52) U.S. Cl. ....................................... 438/25

(58) Field of Classification Search ...................... None
See application file for complete search history.

(56) References Cited

U.S. PATENT DOCUMENTS

| 5,366,906 | A  | * | 11/1994 | Wojnarowski et al. | ........ 438/17 |
| 6,412,641 | B1 | * | 7/2002  | Anderson | ................... 206/714 |
| 2002/0025656 | A1 | * | 2/2002 | Arai et al. | ................... 438/463 |
| 2004/0068869 | A1 | * | 4/2004 | Eldridge et al. | ............... 29/854 |

\* cited by examiner

*Primary Examiner*—Charles D Garber
*Assistant Examiner*—Andre' C Stevenson
(74) *Attorney, Agent, or Firm*—Martine Penilla & Gencarella, LLP

(57) ABSTRACT

A system for separating ICs, including a controller, a fixture and a support material supply. The fixture is coupled to a stretchable substrate and the stretchable substrate has a diced semiconductor wafer secured thereto. The diced semiconductor wafer including the plurality of ICs. The fixture being capable of stretching the stretchable substrate so as to form a corresponding plurality of spaces between each of the plurality of ICs.

17 Claims, 12 Drawing Sheets

SYSTEM AND METHOD FOR SEPARATING AND PACKAGING INTEGRATED CIRCUITS

CROSS REFERENCE TO RELATED APPLICATIONS

This application is a divisional of and claims priority from U.S. patent application Ser. No. 11/288,464 filed on Nov. 28, 2005 now U.S. Pat. No. 7,517,725 and entitled "System and Method for Separating and Packaging Integrated Circuits," which is incorporated herein by reference in its entirety.

BACKGROUND

The present invention relates generally to integrated circuit (IC) manufacturing and more particularly, to methods and systems for separating a semiconductor wafer into multiple ICs.

Integrated circuits (ICs) are typically manufactured in the form of multiple ICs on a single semiconductor wafer. By way of example, a single semiconductor wafer can include hundreds or even thousands of individual ICs. Once the ICs are created on the semiconductor wafer, the wafer is inspected for manufacturing defects. This inspection typically identifies portions of the semiconductor wafer and the ICs contained therein that may not function properly due to detected manufacturing defects. The semiconductor wafer is then cut (i.e., diced) to separate the ICs. Each IC is then typically picked-up and placed in a package for subsequent interconnection to other electrical and physical components.

The package provides electrical contacts, physical and often thermal support for the IC. The package electrical contacts include internal contacts that provide an electrical connection between the package and the contacts (pads, bumps, etc.) on the IC. The package also includes external contacts that provide an electrical connection between the package and any external electrical circuits and components. The corresponding internal contacts and the external contacts are electrically connected. The external contacts are typically larger and more separated than the contacts pads or bumps on the IC itself. The larger, external contacts make it easier to connect external electrical circuits and components to the IC.

Typically, each IC is placed in their respective package by a machine such as a robot in what is commonly referred to as a pick and place operation. The robot picks-up each IC individually and places the IC precisely into the corresponding package. The pick and place robot is typically a very expensive machine so that the robot can move quickly and accurately. The pick and place robot also has a limited throughput because only one or possibly two robots can pickup the ICs. This limited throughput is not a problem for most applications, however, as the number of individual ICs on each semiconductor wafer is increased, the robot's throughput limitation can become problematic.

By way of example, a typical pick and place operation requires about 1 second for the robot to pickup and place each IC. If the semiconductor wafer includes 200 microprocessor ICs then about 200 seconds (3.33 minutes) are required to pickup and place all of the microprocessor ICs. Conversely, if the semiconductor wafer includes 7500 radio frequency identification (RFID) ICs, then the typical pick and place robot would require about 7500 seconds (about 2 hours and 5 minutes) to pickup and place each RFID IC.

One approach to pick and placing many smaller ICs is referred to as a fluidic self assembly (FSA) operation. The FSA operation includes flowing a slurry containing numerous ICs over a surface of a substrate. The substrate has multiple recessed regions. Each recessed rejoin is shaped (e.g., beveled) in such a way that the IC can only fit in a desired orientation.

FSA provides significant improvements in the throughput but with significant shortfalls. The typical FSA operation has relatively low yields of about 60% operationally placed ICs. One reason the ICs fail to be operationally placed is because the nonconforming ICs are added to the slurry and therefore placed in the substrate. If the ICs are sorted prior to being added to the slurry, the pick and place limitations above apply and there is no significant throughput advantage of the FSA process.

Further, the FSA operation does not provide a very efficient package operation. After the FSA operation, each IC is typically soldered to the substrate and a lager portion of the ICs can fail (poor and/or shorted connections) in the soldering operation. Further still, the FSA does not provide effective physical support for the ICs during the remaining packaging operations and many ICs crack and otherwise fail for mechanical reasons.

Therefore, neither the typical pick and place robot operation nor the typical FSA operation are fast enough for placing and packaging ICs. In view of the foregoing, there is a need for a faster, more efficient and more economical system and method for separating and packaging ICs.

SUMMARY

Broadly speaking, the present invention fills these needs by providing a faster, more efficient and more economical system and method for separating and packaging ICs. It should be appreciated that the present invention can be implemented in numerous ways, including as a process, an apparatus, a system, computer readable media, or a device. Several inventive embodiments of the present invention are described below.

One embodiment provides a method of separating an IC. The method includes dicing a semiconductor wafer. The semiconductor wafer includes multiple ICs. The diced wafer is secured to a stretchable substrate. The stretchable substrate can be stretched so as to form corresponding spaces between each of the ICs. The corresponding spaces are filled with a support material.

Stretching the stretchable substrate to form the spaces between each of the ICs can include stretching the stretchable substrate in at least one of an X-direction or a Y-direction. The method can also include forming a contact structure on the support material and at least one corresponding electrical contact on each one of the ICs. The support material can substantially encapsulate each one of the ICs. The method can also include removing a portion of the support material to expose at least a portion of at least one electrical contact on each one of the ICs.

Dicing the wafer can also include inspecting the wafer. Inspecting the wafer can include identifying a portion of the wafer having a non-uniformity. Forming the contact structure on the support material can include forming the contact structure on the ICs that are not included within the non-uniformity.

Forming the contact structure on the support material can include forming a contact structure with a directly electroplatable resin. Forming the contact structure on the support material can also include forming a conductive layer on the support material and a corresponding at least one electrical contact on each one of the ICs. The conductive layer can include a metallic layer.

Forming the contact structure on the support material can include forming an electrical component on the support material. The electrical component formed on the support material can include an interconnecting circuit (e.g., an antenna). The method can also include cutting the support material to form multiple individually supported ICs. Forming the contact structure on the support material can include forming the contact structure around at least one edge of the supported ICs. The method can also include placing one of the supported ICs in an electrical circuit and forming the contact structure on the support material can include forming the contact structure between the contacts on the IC and the electrical circuit. The individually supported ICs can also be secured on the stretchable substrate and the stretchable substrate can be stretched so as to form corresponding spaces between each the individually supported ICs. The corresponding spaces can be filled with the support material.

The diced wafer can be secured to the stretchable substrate with an adhesive material. Filling the spaces with the support material can include removing the stretchable substrate. Filling the corresponding spaces with the support material can include removing the adhesive material from the diced wafer.

The spaces between each of the ICs can have a width of between about 0.01 inches (0.25 mm) and about 6.0 inches (150 mm). The support material can have a thickness about equal to a thickness of the ICs.

Another embodiment can provide a method of forming a package for an IC. The method includes dicing a semiconductor wafer that includes multiple ICs. The diced wafer is secured to a stretchable substrate. The stretchable substrate is stretched so as to form spaces between each of the ICs. The spaces are filled with a support material. The support material is cut to form the supported ICs and a contact structure can be formed including a metallic layer on the support material.

Yet another embodiment provides a system for separating multiple ICs includes a controller, a fixture and a support material supply. The fixture is coupled to a stretchable substrate that has a diced semiconductor wafer secured thereto. The diced semiconductor wafer includes multiple ICs. The fixture is capable of stretching the stretchable substrate so as to form spaces between each of the ICs.

The system can also include a mapping system. The system can also include a contact former. The contact former can include a photolithographic system. The contact former can include a printing system. The contact former is capable of applying a directly electroplatable resin. The contact former can include an electroplating system. The system can also include a cutter capable of cutting the support material to form individually supported ICs.

Still another alternative embodiment provides a method of forming an RF identification (RFID) tag. The method includes dicing a semiconductor wafer that includes multiple RFID receiver/transmitter ICs. The diced wafer is secured to a stretchable substrate and the stretchable substrate is stretched so as to form corresponding spaces between each of the RFID receiver/transmitter ICs. The spaces between the RFID receiver/transmitter ICs are filled with a support material and an antenna on is formed on the support material. The antenna is connected to at least one electrical contact on a corresponding RFID receiver/transmitter IC. The antenna includes a conductive layer. The support material can be cut to form multiple supported RFID tags.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for faster, more efficient and more economical systems and methods for separating and packaging ICs will now be described. It will be apparent to those skilled in the art that the present invention may be practiced without some or all of the specific details set forth herein.

A semiconductor wafer, with multiple ICs formed thereon, can be secured to carrier and then diced. The diced semiconductor wafer is secured to a stretchable substrate and the carrier can be removed. The stretchable substrate can be stretched in a substantially planar fashion in at least one of an X and/or Y direction. In this manner the ICs can be separated in substantially uniform amounts in the respective X and/or Y directions. Supporting material can fill the spaces between the ICs and the stretchable substrate can then be removed. Contact structures can be formed on the supporting material. The contact structures can provide larger electrical connections for connecting external electrical circuits and devices to the IC. The contact structures also electrically connect the larger electrical connections to the corresponding contact pads or bumps on the IC.

Figure 1:
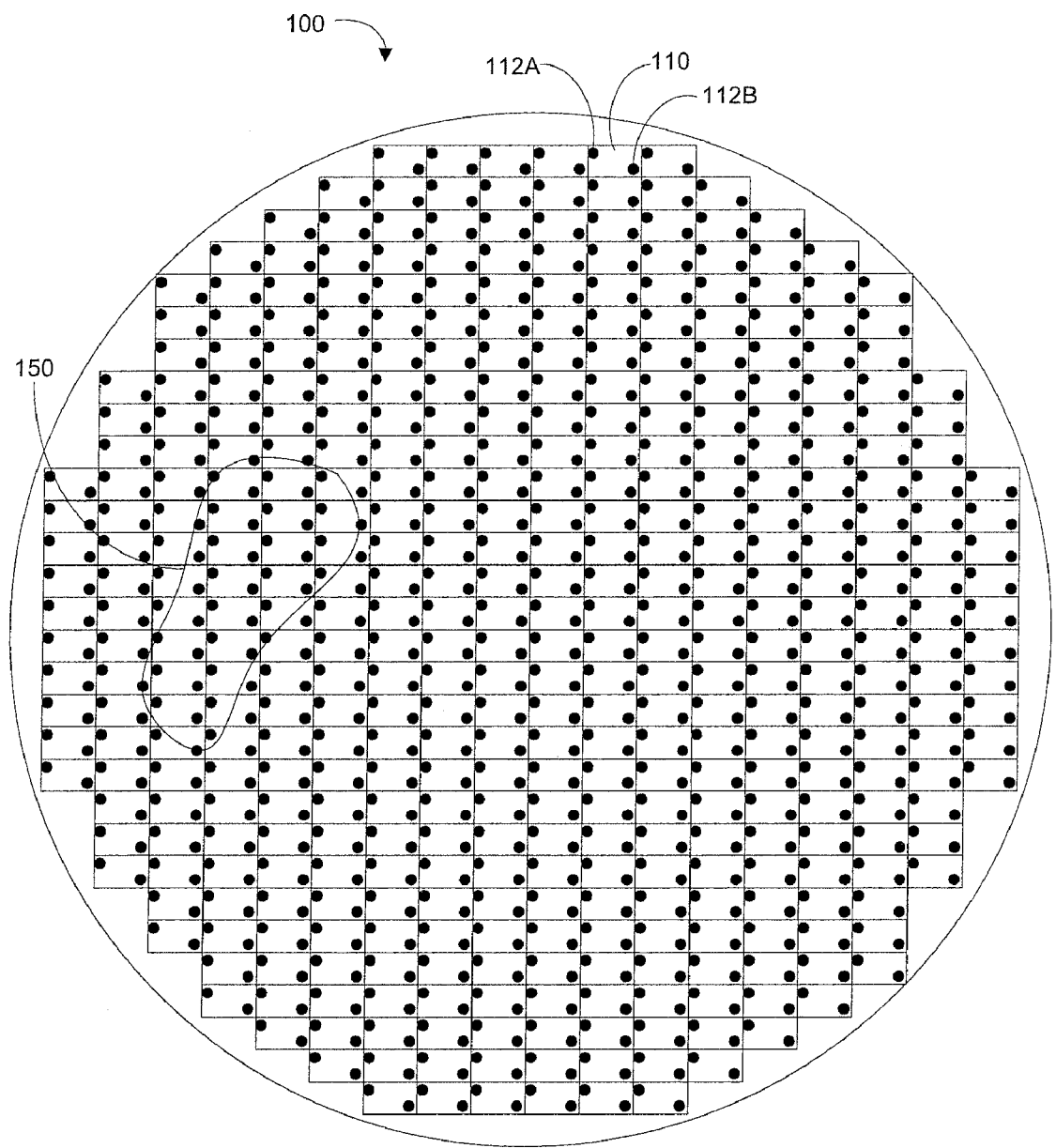
FIG. 1 is a simplified diagram of a semiconductor wafer, in accordance with an embodiment of the present invention.

FIG. 1 is a simplified diagram of a semiconductor wafer 100, in accordance with an embodiment of the present invention. The semiconductor wafer 100 includes many ICs 110 formed thereon. Each of the ICs 110 can be as large as can be accommodated on the wafer 100 and as small as only about 100 micron, or even less, in width and length. The size of each of the ICs 110 is determined by the architecture of the circuits and components formed within each IC and the device size capability of the semiconductor manufacturing processes used. Each of the ICs 110 has one or more electrical contacts 112A and 112B.

Figure 2:
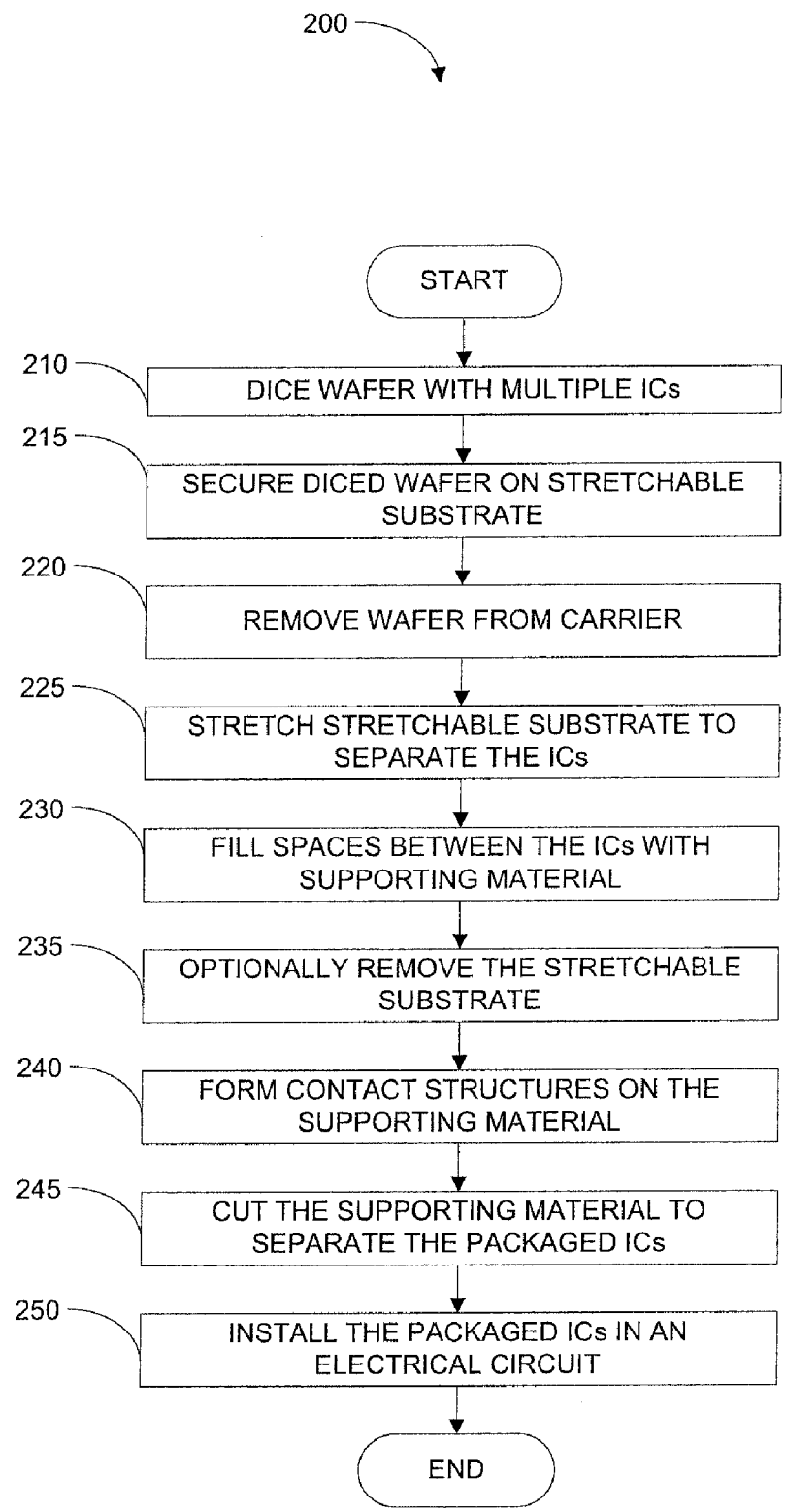
FIG. 2 is a flow chart of the method operations for separating the ICs, in accordance with an embodiment of the present invention.

FIG. 2 is a flow chart of the method operations 200 for separating the ICs, in accordance with an embodiment of the present invention. Multiple ICs 110 have been formed on the semiconductor wafer 100 as described in FIG. 1 above. As discussed above, part of forming the multiple ICs 110 on the semiconductor wafer 100 includes inspecting the wafer. When the semiconductor wafer 100 is inspected, a portion 150 of the wafer may be identified as being defective. By way of example a metallic film can remain on the surface in the portion 150 of the wafer 100. Such a metallic film can cause electrical short circuits in the ICs 110 within region 150. Therefore, the region 150 can be identified and subsequent operations on the ICs 110 will not be applied to the ICs within the region 150. Ultimately, the ICs 110 within the region 150 will be discarded and not used. By way of example, no contact structures will be formed on the ICs 110 within the region 150.

Figure 3A:
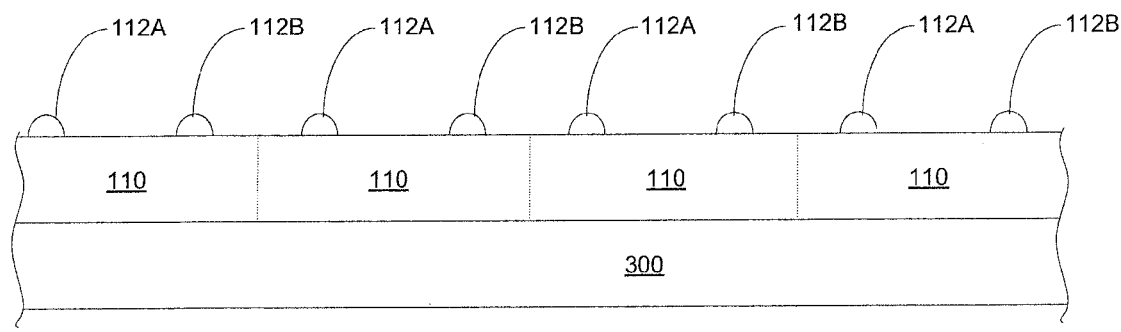
FIGS. 3A and 3B are side views of the semiconductor wafer secured to a carrier, in accordance with an embodiment of the present invention.
Figure 3B:
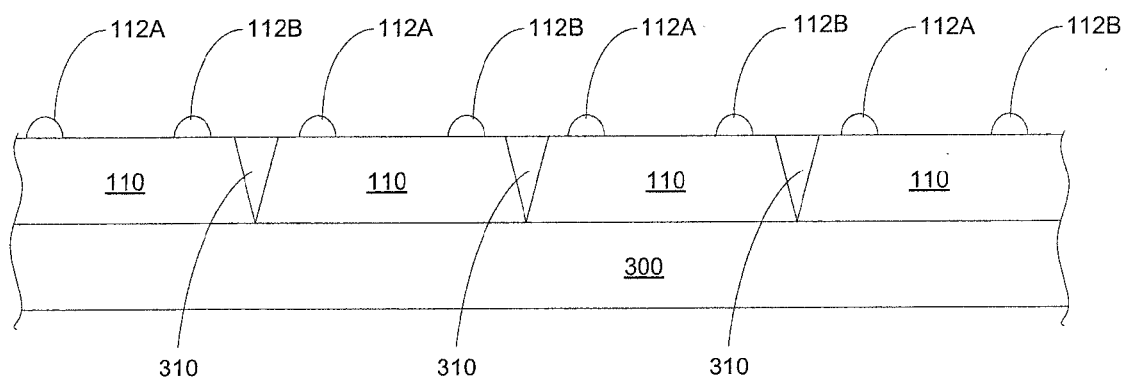

FIGS. 3A and 3B are side views of the semiconductor wafer 100 secured to a carrier 300, in accordance with an embodiment of the present invention. The carrier supports and protects the semiconductor wafer 100 during subsequent operations. It should be noted that the following operations are described in terms of dicing the semiconductor wafer 100 from a front or active side (that side of the wafer including the ICs 110) however, in a substantially similar operations can be applied with dicing the semiconductor wafer 100 from the back side (the back side is opposite the active side).

Referring again to FIG. 2, in an operation 210, the semiconductor wafer 100 is cut or diced to separate the ICs 110. FIG. 3B shows the semiconductor wafer 100 being diced to form grooves 310 between the ICs 110.

Figure 4:
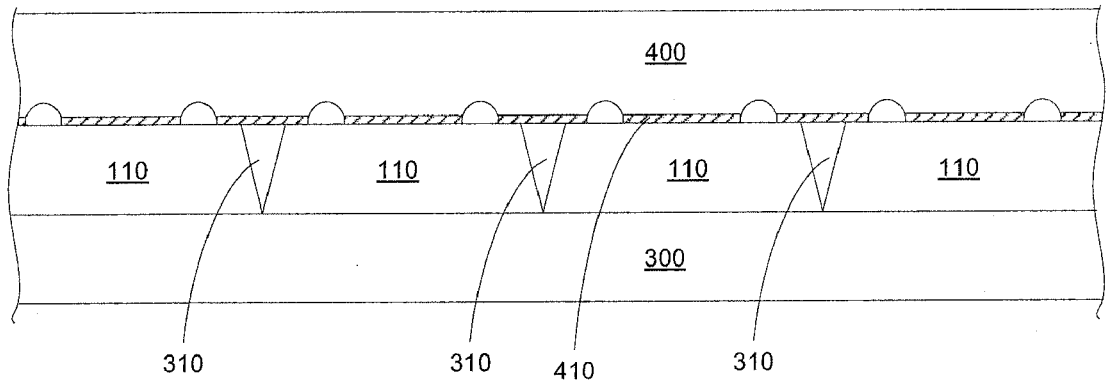
FIG. 4 is a side view of the diced semiconductor wafer secured to the stretchable substrate, in accordance with an embodiment of the present invention.

In an operation 215 in FIG. 2, the diced wafer 100 is secured to a stretchable substrate 400. FIG. 4 is a side view of the diced semiconductor wafer 100 secured to the stretchable substrate 400, in accordance with an embodiment of the present invention. The stretchable substrate 400 can be any suitable material. By way of example, the stretchable substrate 400 can be a room temperature vulcanizing (RTV) silicon material, a polyurethane material, or a natural or a synthetic rubber compounds and combinations thereof. RTV silicone materials can stretch about 500% or even more with excellent tear resistance. One example of a silicone material can be Silastic ™, produced by Dow Corning, Inc. Polyurethane materials can stretch about 700% or more and natural or synthetic rubber compounds can stretch about 1000% or even more. This list of exemplary materials is not meant to be exhaustive but rather exemplary only and any suitable stretchable material can be used for the stretchable substrate 400.

Another way to characterize the suitable stretchable material for the stretchable substrate 400 is to define the material by a desirable stretchable range. The stretchable material used for the stretchable substrate 400 can be stretched from between less than about 50% to more than about 10,000%. By way of example, an IC in an RFID tag can have a width and length of about 0.3 mm or even smaller. If a desired size of an individually supported IC is about 1.8 mm, then the stretchable substrate 400 would include a material that can stretch about 500%. As a more specific example, for the 0.3 mm IC length and width, a 500% stretchable material can create about 1.5 mm of space between ICs (e.g., spaces 610 and 620 as shown in FIG. 6 below). A 1.8 mm square individually supported IC can be easily handled by most electronic assembly equipment. If a smaller individually supported IC is desired, then the percentage the stretchable material is stretched is reduced. Similarly, if a larger individually supported IC is desired, then the percentage the stretchable material is stretched is increased. By way of example, a stretchable material that can be stretched 5000% can yield an individually supported IC having a length and width of about 18.0 mm using an IC that has a length and width of about 0.3 mm. In another example, a stretchable material that can be stretched 300% can yield an individually supported IC having a length and width of about 1.0 mm using an IC that has a length and width of about 0.3 mm stretchable.

The stretchable substrate 400 can adhere to the diced semiconductor wafer 100 as some suitable materials can adhere to the diced semiconductor wafer via electrostatic or other physical forces. An adhesive material 410 can optionally be used to secure the stretchable substrate 400 to the ICs 110 in the diced semiconductor wafer 100. Applying the adhesive material 410 can also include activating the adhesive material. By way of example, some adhesive materials can be activated by heat or ultraviolet light or other types of energy and even chemical activators.

Figure 5:
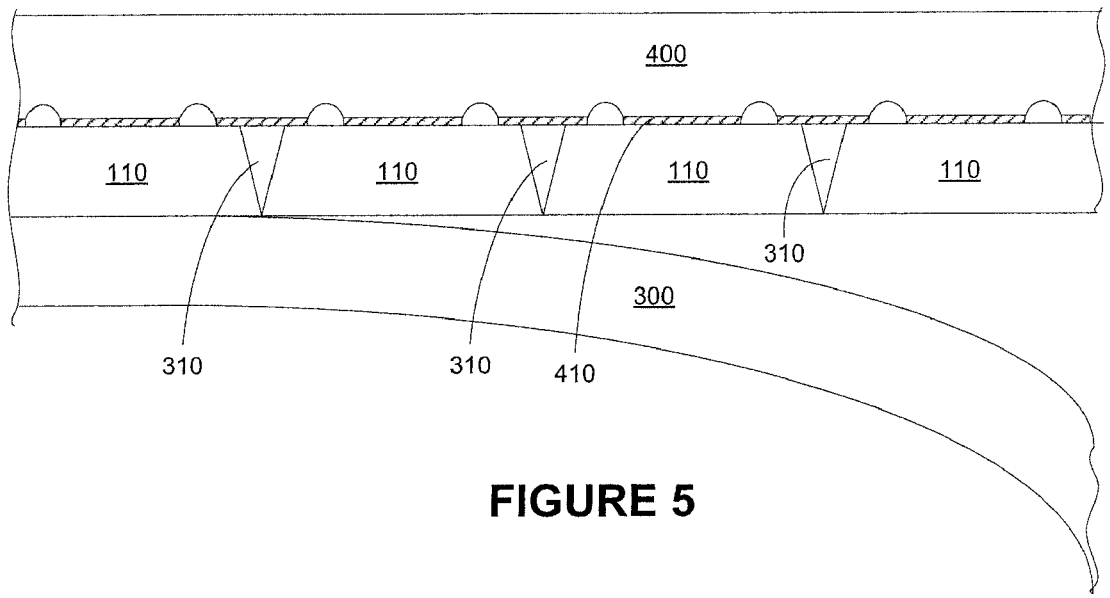
FIG. 5 is a side view of the diced semiconductor wafer secured to the stretchable substrate with the carrier being removed, in accordance with an embodiment of the present invention.

Referring again to FIG. 2, in an operation 220, the carrier 300 is removed from the ICs 110. FIG. 5 is a side view of the diced semiconductor wafer 100 secured to the stretchable substrate 400 with the carrier 300 being removed, in accordance with an embodiment of the present invention.

Figure 6A:
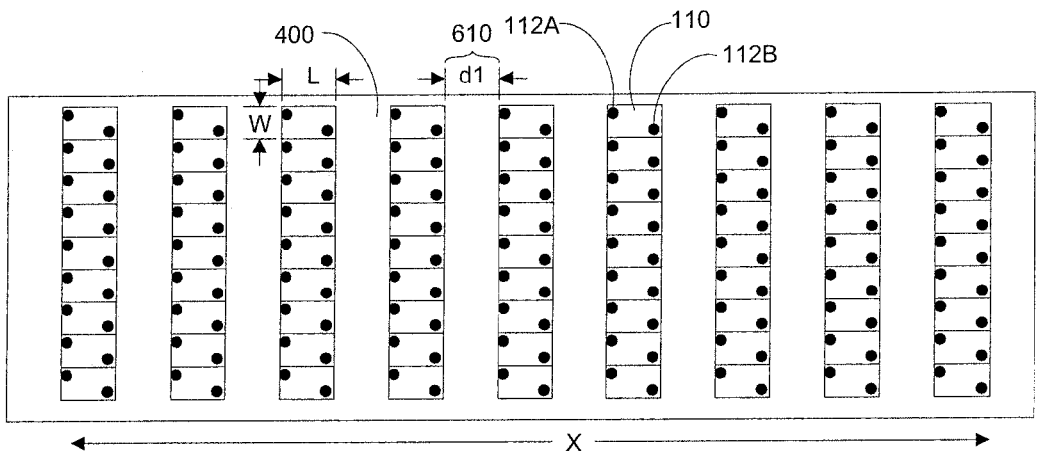
FIGS. 6A and 6B are a top views of the expanded, diced semiconductor wafer 100 secured to the stretchable substrate, in accordance with an embodiment of the present invention.
Figure 6B:
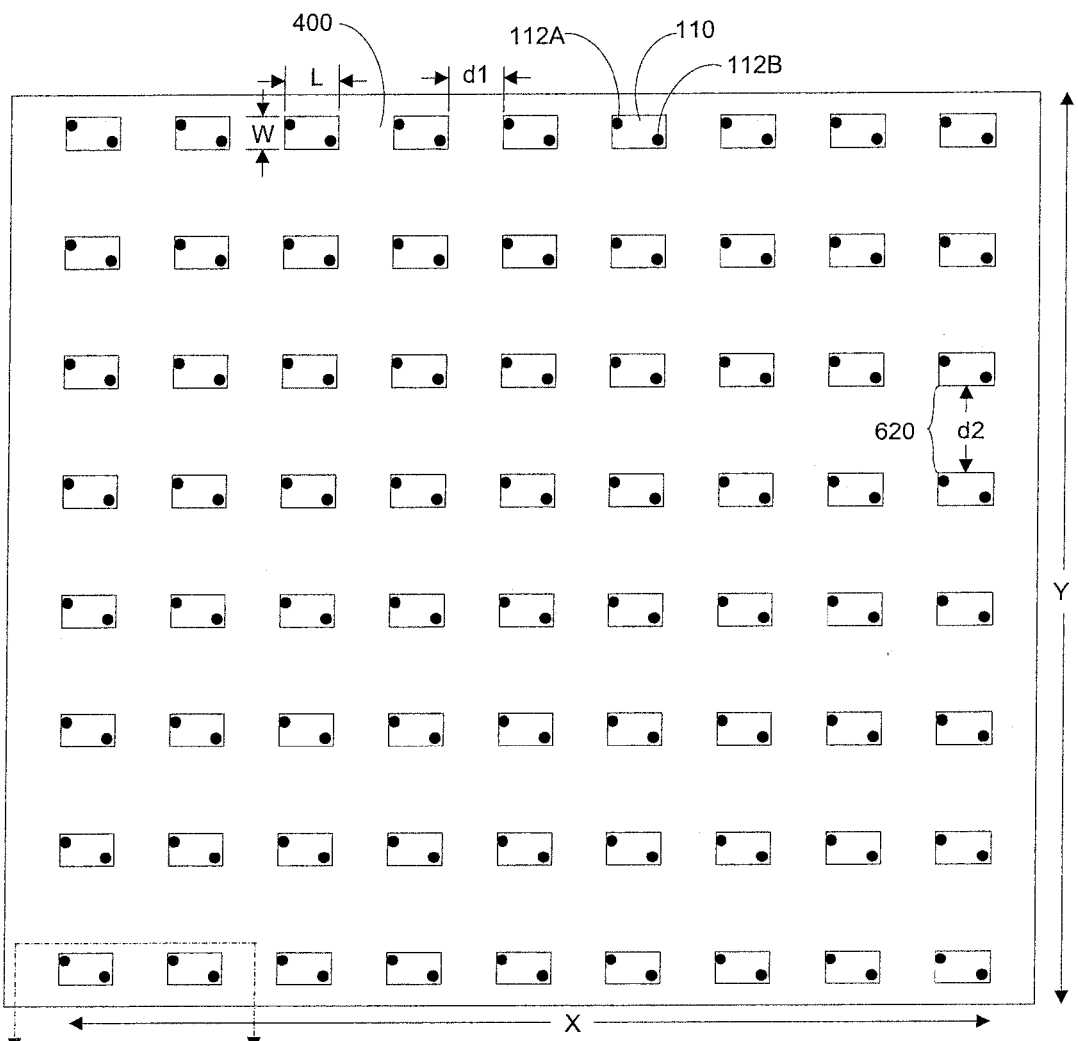

In an operation 225, the stretchable substrate 400 is stretched in at least one substantially planar direction. FIGS. 6A and 6B are top views of the expanded, diced semiconductor wafer 100 secured to the stretchable substrate 400, in accordance with an embodiment of the present invention. In FIG. 6A, the stretchable substrate 400 is stretched in a single direction (e.g., the X direction) to separate the ICs in the X direction. Substantially equal spaces 610 are formed between the columns of the ICs 110 as the stretchable substrate 400 is stretched in the X direction. The spaces 610 are substantially equal because the stretchable substrate 400 stretches substantially uniformly across the X-direction of the stretchable substrate.

As shown in FIG. 6B, the stretchable substrate 400 is stretched in a two directions (e.g., the X and the Y directions) to separate the ICs in both the X and Y directions. In addition to the spaces 610 between the columns of the ICs 110, spaces 620 are formed between the rows of the ICs 110. The spaces 620 are substantially equal because the stretchable substrate 400 stretches substantially uniformly across the Y-direction of the stretchable substrate.

The spaces 610 and the spaces 620 may be substantially equal or different. By way of example, if the stretchable substrate 400 uniformly stretches in both the X-direction and the Y-direction, and the stretchable substrate is stretched the same amount in both the X-direction and the Y-direction, then the spaces 610 and the spaces 620 may be substantially equal sizes. Conversely, if the stretchable substrate 400 stretches at a first rate in the X-direction and a second rate in the Y-direction, and/or the stretchable substrate is stretched the differing amounts in both the X-direction and the Y-direction, then the spaces 610 and the spaces 620 may be substantially different sizes.

It should be noted that FIGS. 6A and 6B are not necessarily drawn to scale. By way of example, the spaces 610 and the spaces 620 can have respective dimensions d1 and d2 of between less than about 0.01 inches (about 0.25 mm) and about 6.0 inches (150 mm) or even more. The respective dimensions d1 and d2 are a function of how far the stretchable substrate 400 is stretched in the respective directions. As discussed above, each of the ICs 110 can have a length L and a width W of between less than about 100 micron and about 12.0 inches (300 mm) or even larger for larger semiconductor wafers.

Figure 7A:
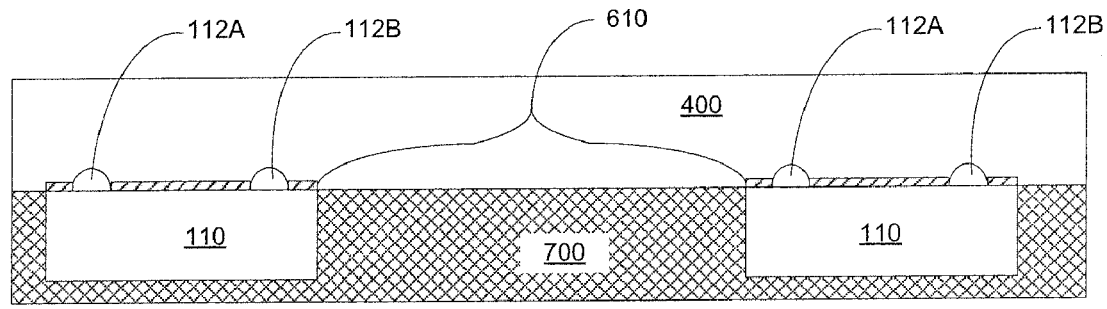
FIGS. 7A-7C are detailed section views (Sect 7-Sect 7) of the expanded, diced semiconductor wafer secured to the stretchable substrate with a supporting material filling the spaces between the ICs, in accordance with an embodiment of the present invention.
Figure 7B:
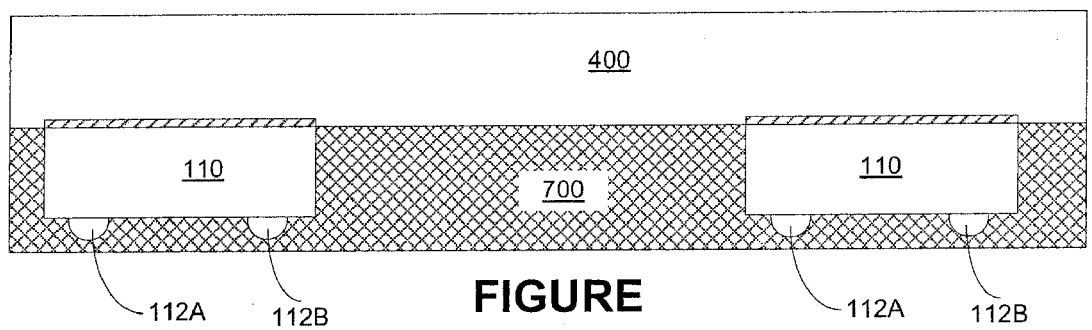
Figure 7C:
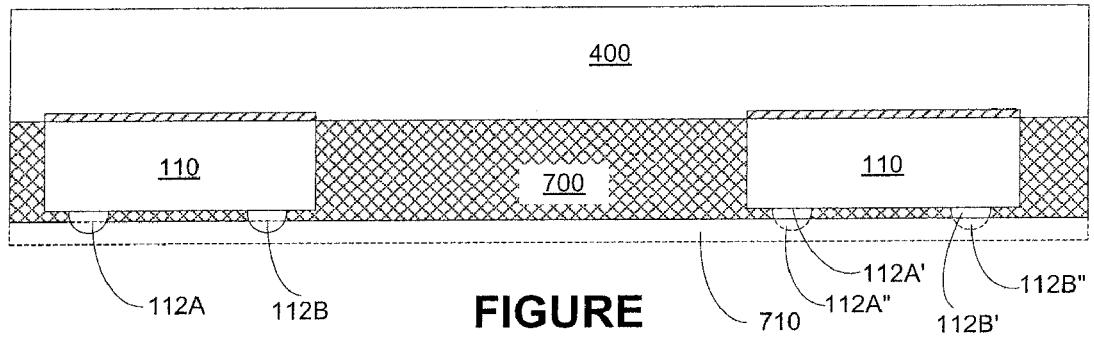

Referring again to FIG. 2, and in an operation 230, the spaces 610 and/or 620 are filled with a supporting material. FIGS. 7A-7C are detailed section views (Sect 7-Sect 7) of the expanded, diced semiconductor wafer 100 secured to the stretchable substrate 400 with a supporting material 700 filling the spaces 610 between the ICs, in accordance with an embodiment of the present invention. The supporting material 700 can fully encapsulate ICs 110 as shown. Alternatively, the supporting material 700 can be limited to the spaces at a depth sufficient to only fill the spaces 610.

The supporting material 700 can be any suitable supporting material. By way of example a polymer can be used. The supporting material 700 can be a polymer that is selectively curable. By way of example, the supporting material 700 can be cured or activated by applying a selected energy. The selected energy can be a heat, a UV or pressure or other energy and combinations thereof. By way of example, the supporting material 700 can fill the spaces 610 and 620 in a liquid form and be cured to a solid form when desired. Similarly a solid form can be pressed and/or melted into the spaces 610 and 620.

The supporting material 700 can have a thickness about equal to or slightly less than or greater than the thickness of the ICs 110. The supporting material 700 can be substantially rigid or flexible. The supporting material 700 can protect the ICs 110 from damage (e.g., cracking) as subsequent operations are applied to the ICs 110. As will be described in more detail below, the supporting material 700 can also be used as a base substrate to form contacts for the ICs 110 and other electrical component structures.

In yet another alternative, as shown in FIG. 7B, the electrical contact bumps 112A and 112B are encapsulated in the supporting material 700. The portion 710 of the supporting material 700 covering the contact bumps 112A and 112B can be removed in a burnishing, etching, polishing or other suitable operation. Similarly, portions 112A" and 112B" of the contact bumps 112A' and 112B' are removed. As a result at least a portion of the electrical contact bumps 112A and 112B are exposed as shown in FIG. 7C.

Figure 8A:
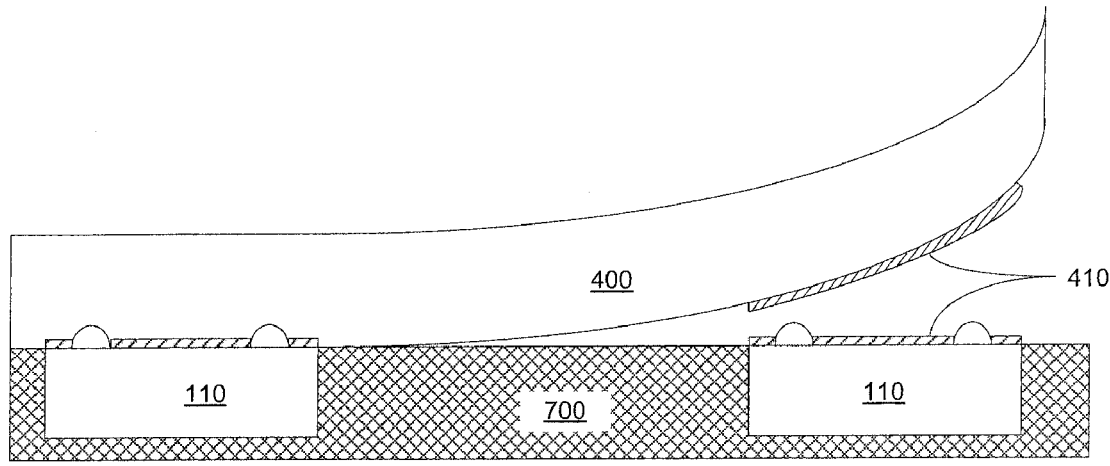
FIGS. 8A and 8B are side views of the expanded, diced semiconductor wafer secured to the stretchable substrate with the supporting material filling the spaces between the ICs, in accordance with an embodiment of the present invention.
Figure 8B:
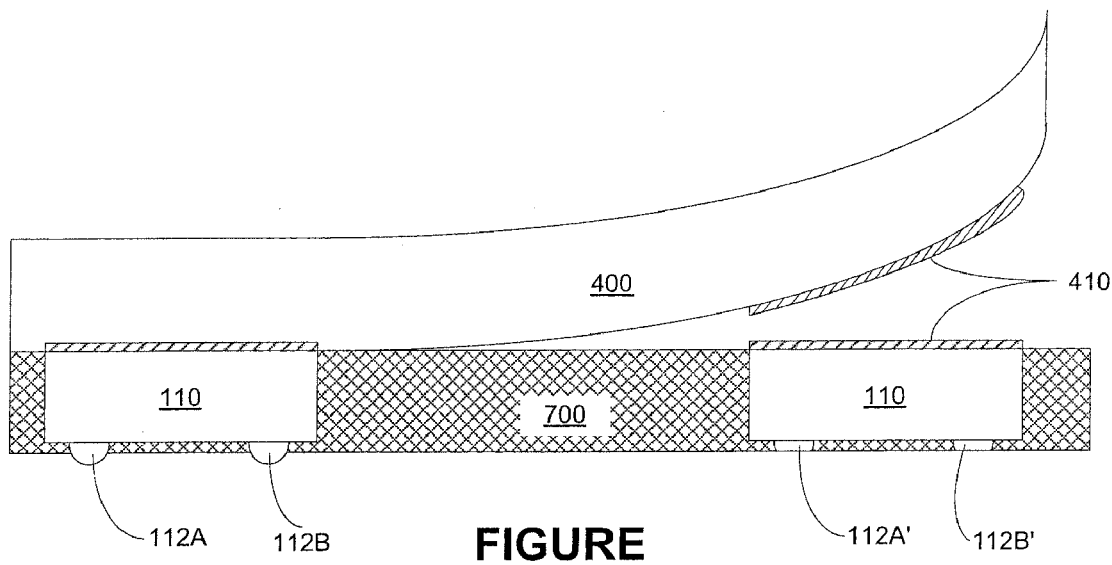

In an operation 235 of FIG. 2, the stretchable substrate 400 can be removed, if necessary. FIGS. 8A and 8B are side views of the expanded, diced semiconductor wafer 100 secured to the stretchable substrate 400 with the supporting material 700 filling the spaces 610 between the ICs 110, in accordance with an embodiment of the present invention. As shown in FIG. 8A, the adhesive layer 410 splits as the stretchable substrate 400 is removed from the ICs 110. The adhesive 410 can remain on either one or both of the stretchable substrate 400 or the ICs 110. As the stretchable substrate 400 is removed, the electrical contact bumps 112A and 112B are exposed.

Figure 9A:
FIGS. 9A and 9B are diagrams of the ICs secured in the supporting material, in accordance with an embodiment of the present invention.
Figure 9B:
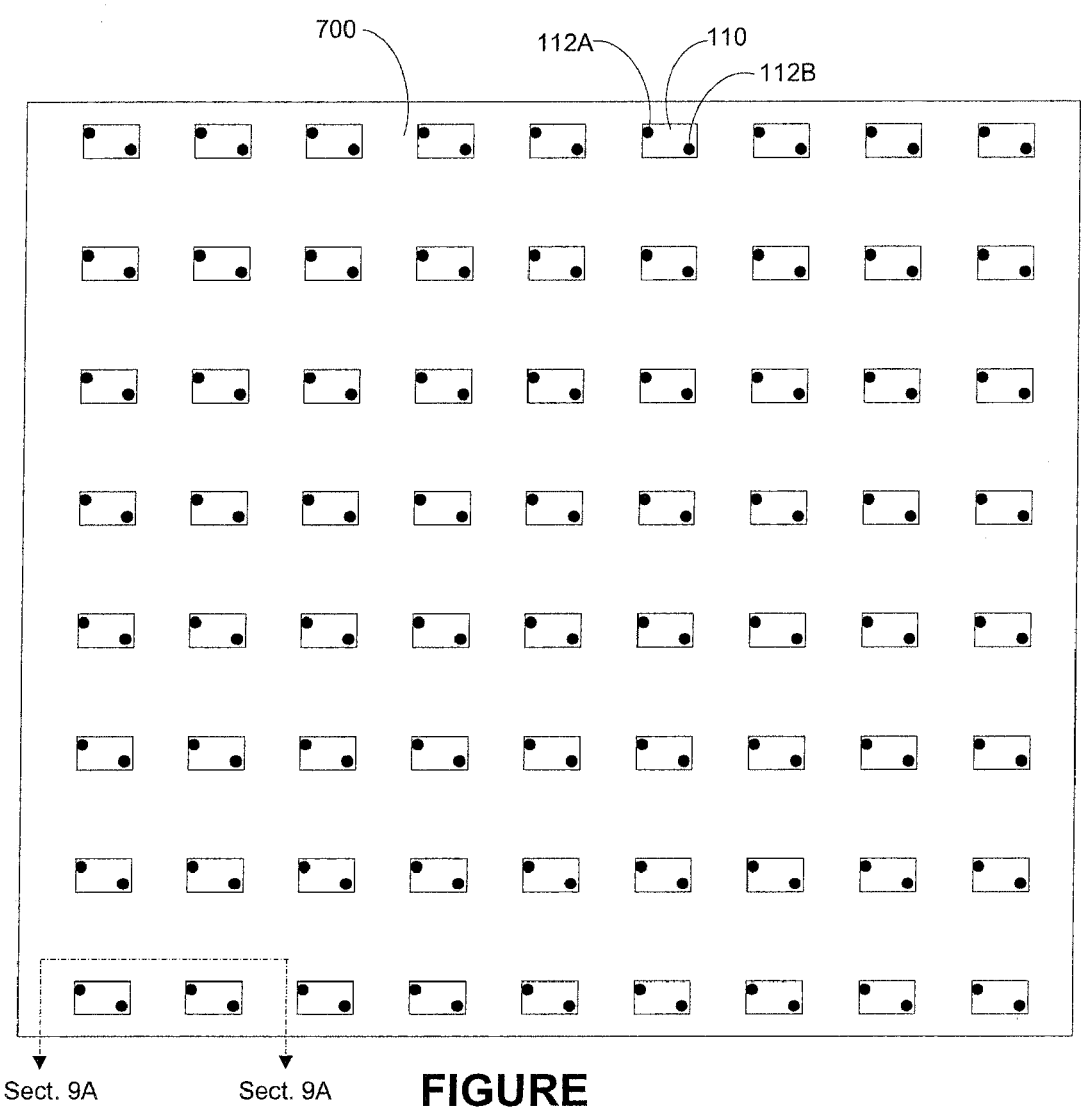

Alternatively, as shown in FIG. 8B, the stretchable substrate 400 does not cover the electrical contact bumps 112A and 112B so the stretchable substrate can be left in place, if desired. In an optional operation, the adhesive 410 can be removed. FIGS. 9A and 9B are diagrams of the ICs secured in the supporting material 700, in accordance with an embodiment of the present invention. FIG. 9A shows a side view of the ICs secured in the supporting material 700. FIG. 9B shows a top view of the ICs secured in the supporting material 700. It should be noted that operations 210 through 235 can be applied iteratively to produce a desired size of an individually supported IC 110. By way of example using a stretchable substrate 400 that can be stretch about 500%, a first iteration can yield an individually supported IC having a width of about 1.8 mm. A second iteration can yield an individually supported IC having a width of about 9.0 mm. A third iteration can yield an individually supported IC having a width of about 45.0 mm. The length of the individually supported IC can be similarly increased iteratively at the simultaneously with or subsequent to increasing the width.

Figure 10A:
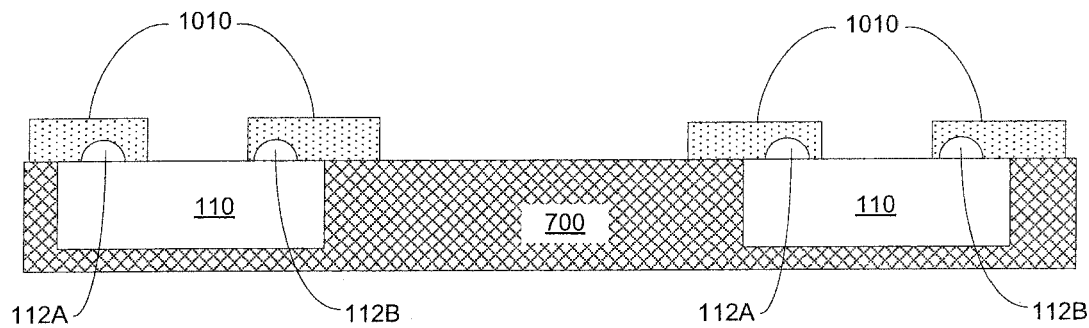
FIGS. 10A and 10B are diagrams of the ICs secured in the supporting material with contact structures formed thereon, in accordance with an embodiment of the present invention.
Figure 10B:
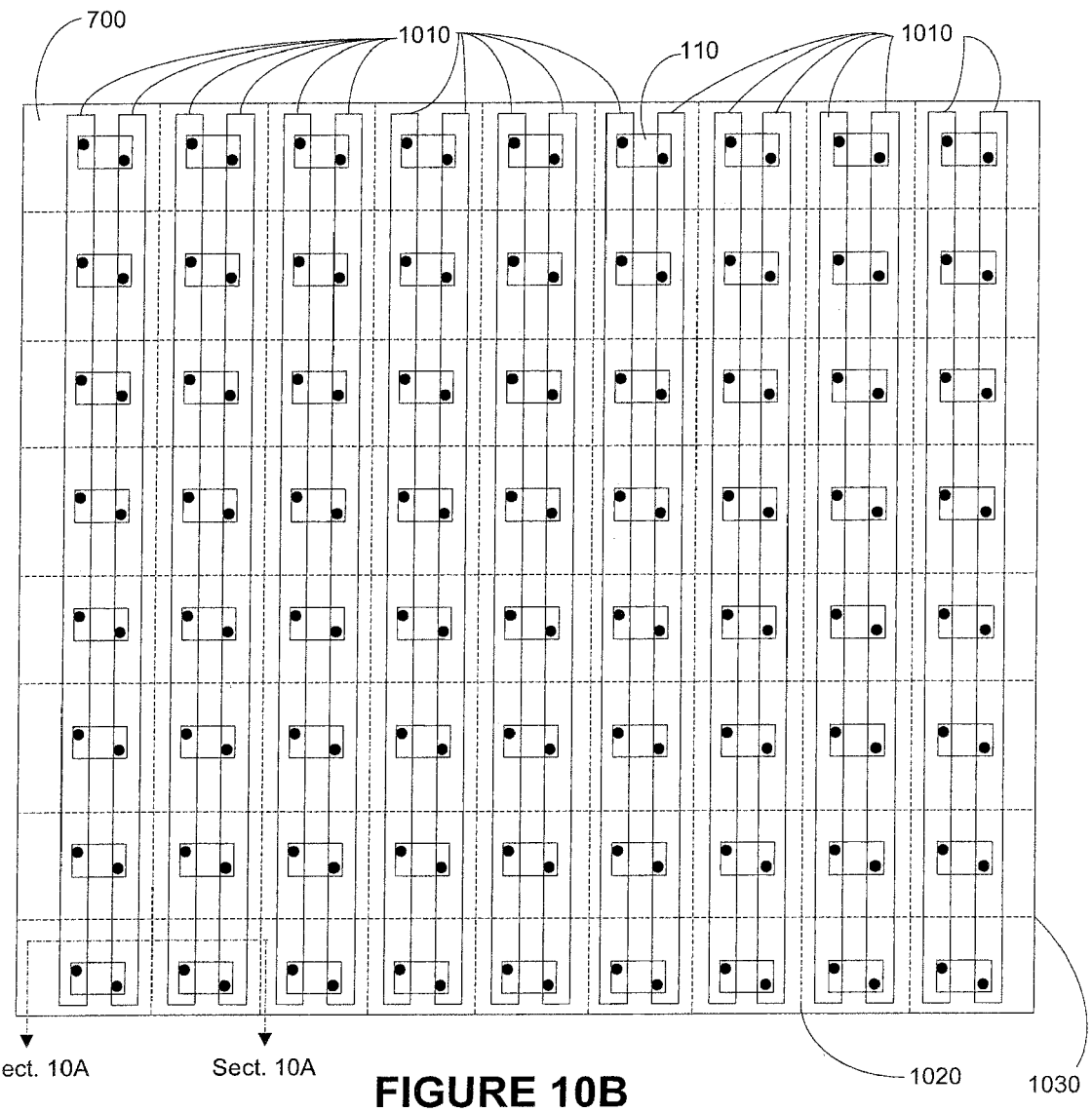

Referring again to FIG. 2, in an operation 240, contact structures can be formed over the electrical contact bumps 112A and 112B on the ICs 110 and on the supporting material 700. FIGS. 10A and 10B are diagrams of the ICs secured in the supporting material 700 with contact structures 1010 formed thereon, in accordance with an embodiment of the present invention. FIG. 10A is a sectional view (Sect. 10A-10A) of the ICs 110 and the contact structures 1010. FIG. 10B shows a top view of the ICs and the contact structures 1010. The contact structures 1010 can be formed with directly electroplatable resin (DER) or similar metallization seed type materials. As will be described in more detail below, a metallization operation can be applied to form a layer of conductive material on the contact structures 1010. The DER can be applied with any suitable process. By way of example the DER can be applied using a photolithographical process or printed using ink jet-type and other direct to surface printing processes as are well known in the art.

In an operation 245 of FIG. 2, the supporting material 700 can be cut to separate the ICs 110 into separate, fully supported ICs 110'. As shown in FIG. 10, the dashed lines 1020 indicate where supporting material 700 can be cut to form the strips of ICs 110 supported in the supporting material. The strips of ICs 110 can be cut along dashed lines 1030 to separate the fully supported ICs 110'.

As the ICs 110 are fully supported in the supporting material 700 and the contact structures 1010 have been formed to allow easy connection to external electrical circuits and components, then the ICs 110 are effectively packaged without the need of a pick and place operation or a separate manufacture of a "package" itself.

Figure 11:
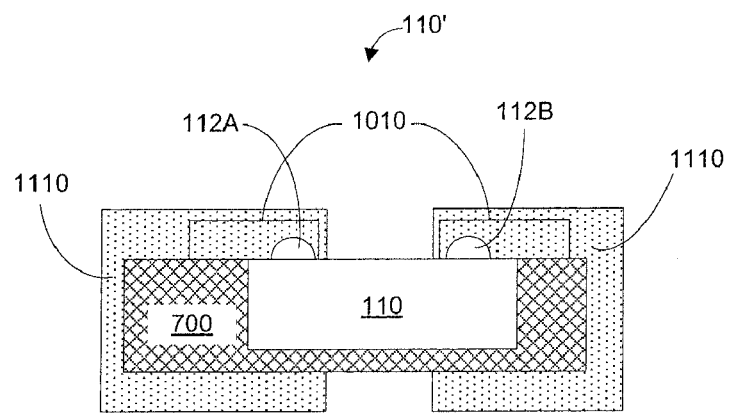
FIG. 11 is a detailed side view of a packaged IC and the contact structures formed thereon, in accordance with an embodiment of the present invention.

FIG. 11 is a detailed side view of a packaged IC 110' and the contact structures 1010 formed thereon, in accordance with an embodiment of the present invention. Additional contact structures 1110 can be added to the separated packaged IC 110' or to the strips of IC's. The additional contact structures 1110 can wrap around the edge of the IC 110.

Figure 12:
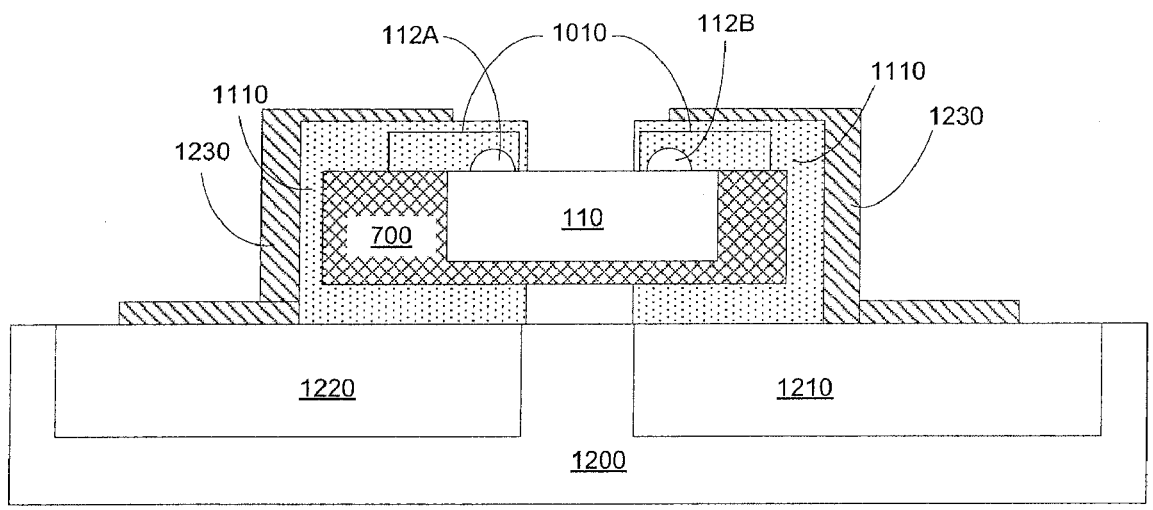
FIG. 12 is a detailed side view of a packaged IC and external circuit components electrically connected to the contact structures, in accordance with an embodiment of the present invention.

Referring again to FIG. 2, in an operation 250, the packaged ICs 110' can be installed in an electrical circuit. FIG. 12 is a detailed side view of a packaged IC 110' and external circuit components 1210 and 1220 electrically connected to the contact structures 1010 and 1110, in accordance with an embodiment of the present invention. The circuit components 1210 and 1220 can be contact structures or actual components. By way of example the packaged IC 110' can be a transmitter and/or a receiver and the circuit components 1210 and 1220 can be antennae coupled to antenna connections 112A and 112B through the contact structures 1010 and 1110.

The contact structures 1010 and 1110 can also have a metallization layer 1230 formed thereon. The metallization layer 1230 will substantially form only on compatible materials such as a metallization seed material (e.g., the contact structures 1010 and 1110).

Figure 13:
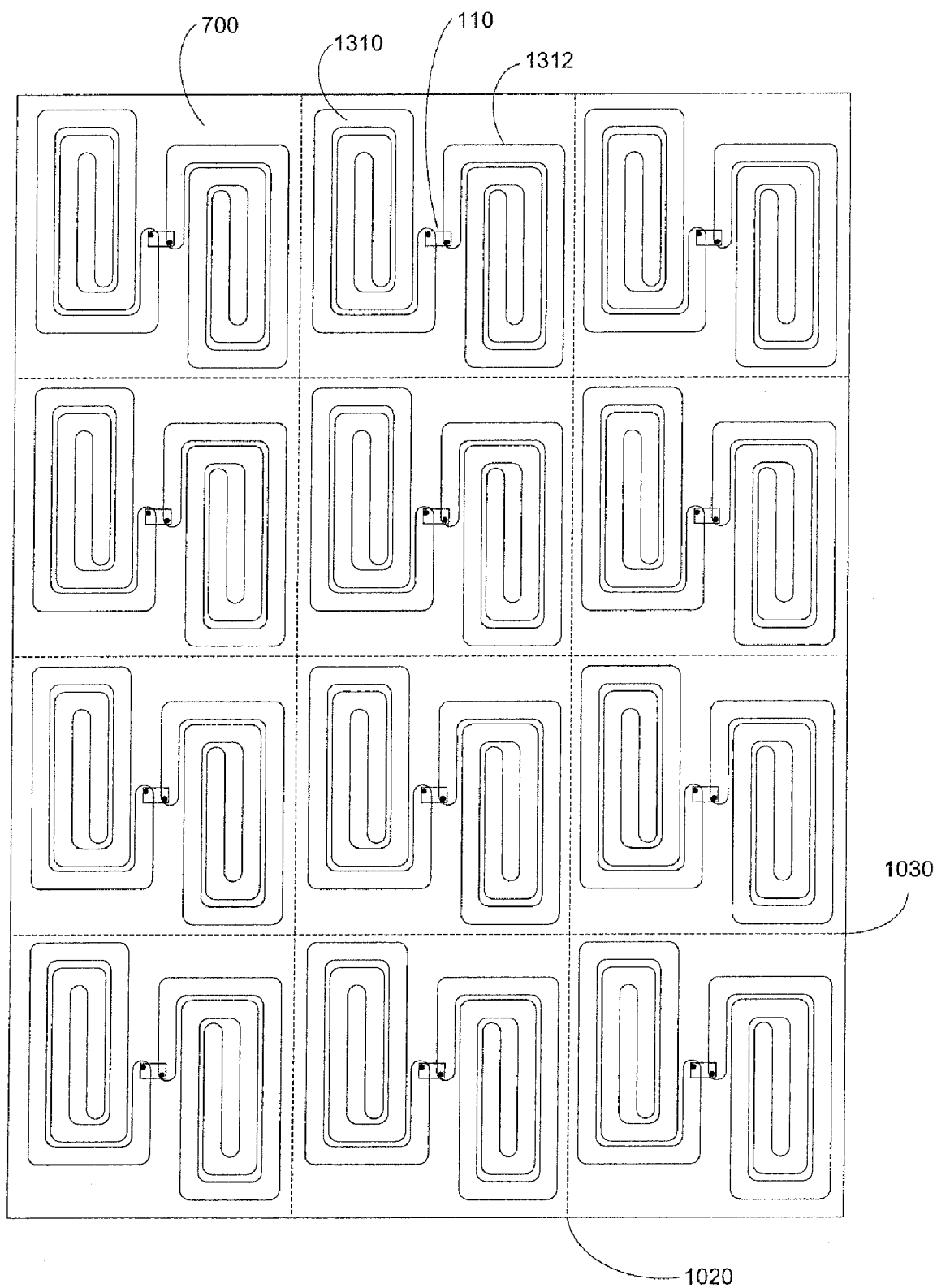
FIG. 13 is a top view of the ICs secured in the supporting material with antennas formed on the supporting material, in accordance with an embodiment of the present invention.

FIG. 13 is a top view of the ICs secured in the supporting material 700 with antennas 1310 and 1312 formed on the supporting material, in accordance with an embodiment of the present invention. The antennas 1310 and 1312 can be formed by forming contact structures in the desired shape of the antennas. A metallization process can be applied to form a conductive layer on the contact structures. This can be especially helpful if the ICs 110 are receivers and/or transmitters (e.g., RF identification receiver transmitters). Each of the ICs 110 and the respective antennas 1310 and 1312 can form a completed RFID tag.

Figure 14:
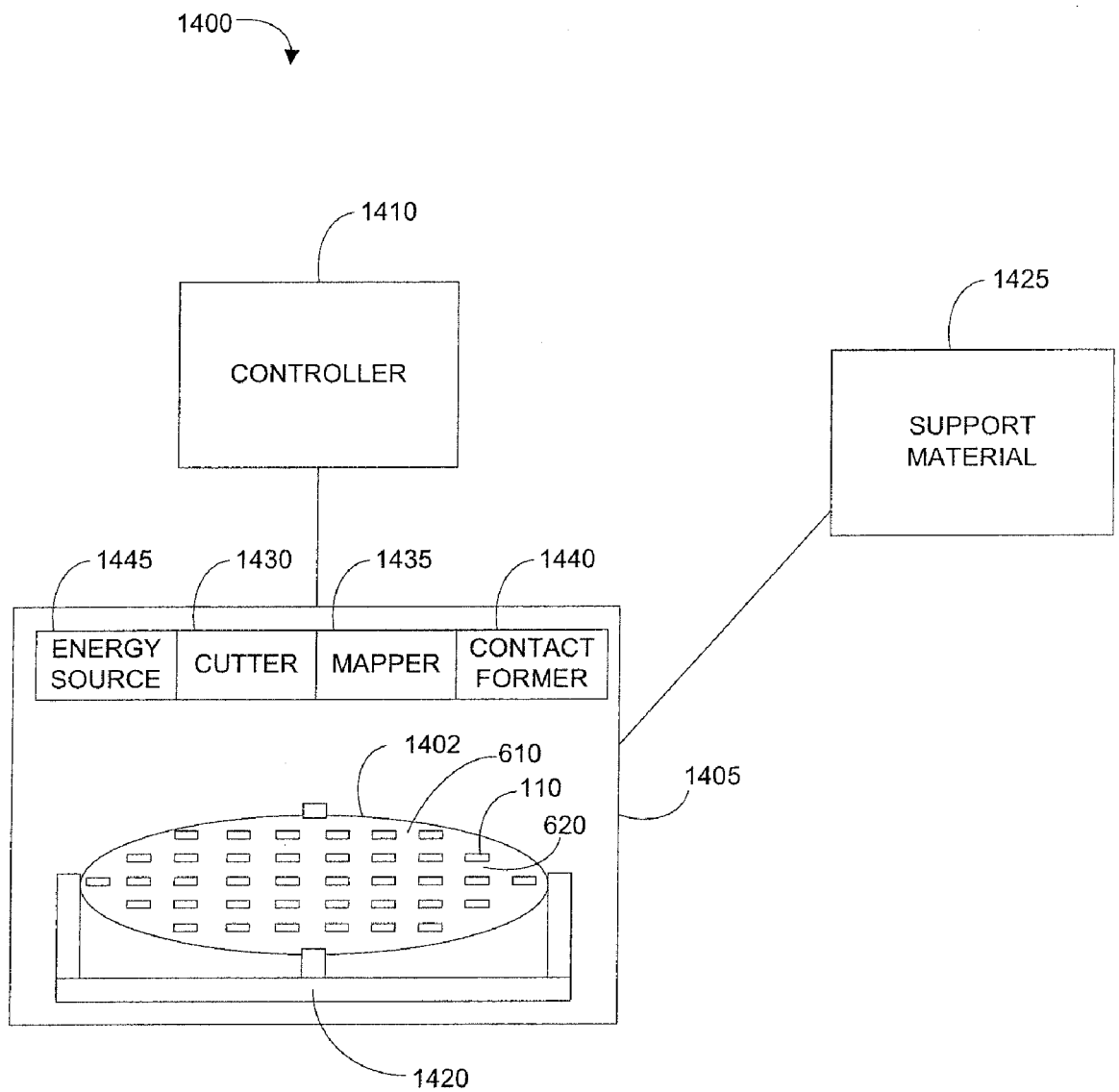
FIG. 14 is a schematic view of a system for separating a plurality of ICs, in accordance with an embodiment of the present invention.

FIG. 14 is a schematic view of a system 1400 for separating a plurality of ICs 110, in accordance with an embodiment of the present invention. The system 1400 includes a controller 1410 coupled to a processor 1405. The processor 1405 can provide an enclosure for processing the wafer 1402. The system 1400 also includes a fixture 1420 in the processor 1405. The fixture 1420 can be coupled to the stretchable substrate that has a diced semiconductor wafer 1402 secured thereto. As described above, the diced semiconductor wafer 1402 has multiple ICs 110. As shown, the fixture 1420 has stretched the stretchable substrate which separated the multiple ICs 110 and forms spaces 610 and 620 between the ICs. It should be noted that the wafer 1402, ICs 110, and spaces 610 and 620 are not necessarily drawn to scale.

The system 1400 also includes a support material supply 1425. The support material supply 1425 provides a source of the support material that is used to fill in the spaces 610 and 620. The support material can be in a liquid, gaseous powder or other suitable form. An energy source 1445 can be used to apply energy (e.g., light, heat, etc.) to the diced semiconductor wafer 1402. The energy can be used to activate or melt the support material into the spaces 610 and 620.

The system 1400 can also include an inspector/mapper 1435. The mapper 1435 can inspect the wafer 1402 for non-uniformity and map the ICs 110 included in the non-uniformity as described above.

The system 1400 can also include a contact former 1440. The contact former 1440 can form the contacts on the ICs 110 and the support material as described in more detail above.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A system for separating a plurality of ICs, comprising:
   a controller;
   a fixture, the fixture coupled to a stretchable substrate, the stretchable substrate having a diced semiconductor wafer secured thereto, the diced semiconductor wafer including a plurality of ICs, the fixture being capable of stretching the stretchable substrate so as to form a corresponding plurality of spaces between each of the plurality of ICs; and
   a support material supply coupled to the fixture and being capable of delivering support material into the corresponding plurality of spaces between each of the plurality of RFID integrated circuits.

2. The system of claim 1, further comprising a mapping system.

3. The system of claim 1, further comprising a contact former.

4. The system of claim 3, wherein the contact former includes a photolithographic system.

5. The system of claim 3, wherein the contact former includes a printing system.

6. The system of claim 3, wherein the contact former is capable of applying a directly electroplatable resin.

7. The system of claim 3, wherein the contact former includes an electroplating system.

8. The system of claim 1, wherein the plurality of ICs includes a plurality of RFID integrated circuits.

9. The system of claim 8, further comprising a cutter for cutting the support material to form a plurality of supported ICs.

10. The system of claim 1, wherein stretching the stretchable substrate so as to form the corresponding plurality of spaces between each of the plurality of ICs includes stretching the stretchable substrate in at least one of an X-direction or a Y-direction.

11. The system of claim 1, wherein the support material substantially encapsulates each one of the plurality of ICs.

12. The system of claim 1, further comprising an inspection system for inspecting the semiconductor wafer.

13. The system of claim 1, wherein the corresponding plurality of spaces between each of the plurality of ICs have a width of between about 0.01 inches and about 1.0 inches.

14. The system of claim 1, wherein the support material has a thickness about equal to a thickness of the ICs.

15. The system of claim 1, wherein the plurality of ICs has at least one of a width or length of less than about 0.3 mm.

16. The system of claim 1, wherein the controller includes:
   logic for stretching the stretchable substrate so as to form a corresponding plurality of spaces between each of the plurality of ICs; and
   logic for filling the corresponding plurality of spaces with a support material.

17. A system for separating a plurality of RFID integrated circuits, comprising:
   a controller;
   a fixture, the fixture coupled to a stretchable substrate, the stretchable substrate having a diced semiconductor wafer secured thereto, the diced semiconductor wafer including the plurality of RFID integrated circuits, the fixture being capable of stretching the stretchable substrate so as to form a corresponding plurality of spaces between each of the plurality of RFID integrated circuits;
   a support material supply coupled to the fixture and being capable of delivering support material into the corresponding plurality of spaces between each of the plurality of RFID integrated circuits;
   a cutter capable of cutting the support material to form a plurality of individually supported RFID integrated circuits;
   a printing system; and
   a source of electroplatable resin coupled to the printing system, wherein the printing system is capable of applying the directly electroplatable resin to the individually supported RFID integrated circuits.

* * * * *